United States Patent [19]

Tanaka et al.

[11] Patent Number: 5,624,885
[45] Date of Patent: Apr. 29, 1997

[54] JOSEPHSON JUNCTION DEVICE OF OXIDE SUPERCONDUCTOR AND PROCESS FOR PREPARING THE SAME

[75] Inventors: Saburo Tanaka; Takashi Matsuura; Hideo Itozaki, all of Hyogo, Japan

[73] Assignee: Sumitomo Electric Industries, Ltd., Osaka, Japan

[21] Appl. No.: 526,306

[22] Filed: Sep. 11, 1995

Related U.S. Application Data

[63] Continuation of Ser. No. 386,217, Feb. 9, 1995, abandoned, which is a continuation of Ser. No. 913,711, Jul. 16, 1992, abandoned.

[30] Foreign Application Priority Data

| Jul. 16, 1991 | [JP] | Japan | 3-201220 |
| Jul. 16, 1991 | [JP] | Japan | 3-201221 |
| Jul. 8, 1992 | [JP] | Japan | 4-204372 |

[51] Int. Cl.$^6$ .................................................. H01L 39/22
[52] U.S. Cl. .......................... 505/234; 505/702; 257/31; 257/32; 257/33; 257/34
[58] Field of Search ................................ 257/31, 32, 33, 257/34, 35; 503/702, 234

[56] References Cited

U.S. PATENT DOCUMENTS

| 4,980,341 | 12/1990 | Gehring | 257/34 |
| 5,053,383 | 10/1991 | Short et al. | 257/34 |
| 5,157,466 | 10/1992 | Char et al. | 357/5 |

FOREIGN PATENT DOCUMENTS

| 0327493 | 8/1989 | European Pat. Off. . | |
| 2-137378 | 5/1990 | Japan | 257/33 |
| 2140998 | 12/1984 | United Kingdom . | |

OTHER PUBLICATIONS

Dimos et al., "Orientation Dependence of Grain–Bounding Critical Currents in $YBa_2Cu_3O_{7-\delta}$ Bicrystals", Physical Review Letters, vol. 61, No. 2, Jul. 11, 1988, pp. 219–222.

Char et al., "Bi–Epitaxial Grain Boundary Junctions in $YBa_2Cu_3O_7$", Applied Physics Letters, vol. 59, No. 6, Aug. 5, 1991, pp. 733–735.

M. Kawabara, et al. "Grain Size Dependence of the Critical Density in $YBa_2Cu_3O_x$ Superconductors", Appl. Phys. Lett. 55(26), 25 Dec. 1989, pp. 2781–2783.

Mailly et al., "Experimental Setup for the Measurement of Persistent Current in a GaAs/GaAlAs Single Loop," *Microelectronic Engineering*, vol. 9, Nos. 1–4, pp. 349–351 (May 1989).

Ramesh et al., "Epitaxy of Y–Ba–Cu–O Thin Films Grown on Single–Crystal MgO," *Applied Physics Letters*, vol. 56, No. 22, pp. 2243–2245 (May 1990).

Gross et al., "Low Noise $YBa_2$–$Cu_3$–$O_{7-\delta}$ Grain Boundary Junction dc Squids," *Applied Physics Letters*, vol. 57, No. 7, pp. 727–729 (Aug. 1990).

Garrison et al., "Observation of Two In–Plane Epitaxial States in $YBa_2$–$Cu_3$–$O_{7-\delta}$ Films on yttria–stabilized $ZrO_2$," *Applied Physics Letters*, vol. 58, No. 19, pp. 2168–2170 (May 1991).

Char et al., "Bi–Epitaxial Grain Boundary Junctions in $YBa_2$–$Cu_3$–$O_7$," *Applied Physics Letters*, vol. 59, No. 6, pp. 733–735 (Aug. 1991).

*Primary Examiner*—Robert Kunemund
*Attorney, Agent, or Firm*—Foley & Lardner

[57] ABSTRACT

A Josephson junction device includes a substrate, an oxide thin film formed on a portion of the principal surface of the substrate, which is constituted of a single crystal of which lattices shift at angle of 45° to that of the principal surface of the substrate. One of the two portions of the oxide superconductor thin film is formed on the oxide thin film and the other portion of the superconductor thin film is formed on the principal surface of the substrate directly so that the lattices of the two portions of the oxide superconductor thin film are respectively linear up to those of the oxide thin film and the principal surface of the substrate and the grain boundary. The grain boundary which constitutes a weak link of the Josephson junction is formed just on the step portion formed of the oxide thin film.

10 Claims, 2 Drawing Sheets

JOSEPHSON JUNCTION DEVICE OF OXIDE SUPERCONDUCTOR AND PROCESS FOR PREPARING THE SAME

This application is a continuing application of Ser. No. 08/386,217, filed Feb. 9, 1995 now abandoned, which is a continuation of Ser. No. 07/913,711, filed Jul. 16, 1992 now abandoned.

BACKGROUND OF THE INVENTION

1. Field of the Invention

The present invention relates to a Josephson junction device of an oxide superconductor having at least one Josephson junction and a process for preparing the Josephson junction device, and more specifically to a Josephson junction device of an oxide superconductor, of which the tunnel barrier is constituted of a grain boundary of two single crystal oxide superconductor regions and a process for preparing the Josephson junction and the superconducting device.

2. Description of Related Art

A Josephson junction which is one of superconducting junctions can be realized in various structures. Among the various structures, the most preferable structure in practice is a stacked junction realized by a thin non-superconductor layer sandwiched between a pair of superconductors. However, a point contact type junction, a Dayem bridge type junction and a variable thickness bridge type junction which are composed of a pair of superconductor regions which are weakly linked to each other also exhibit Josephson effect. In general, these Josephson junctions have fine structures in which the superconductor and non-superconductor are composed of thin films.

In order to realize a stacked type junction by using an oxide superconductor, a first oxide superconductor thin film, a non-superconductor thin film and a second oxide superconductor thin film are stacked on a substrate in the named order.

In the above mentioned stacked type junction, an insulator MgO etc., a semiconductor Si etc.. and a metal Au etc. are used for the non-superconductor layers of different applications so that each superconducting junction has different properties.

The thickness of the non-superconductor layer of the stacked type junction is determined by the coherence length of the superconductor. In general, the thickness of the non-superconductor layer of the stacked type junction must be within a few times of the coherence length of the superconductor. On the other hand, since oxide superconductor materials have a very short coherence length, therefore, a thickness of a non-superconductor layer must be about a few nanometers.

However, the superconductor layers and the non-superconductor layer of the stacked type junction must be of high crystallinity for favorable junction properties, which are composed of single crystals or composed of polycrystals which are oriented in almost same direction. It is difficult to stack an extremely thin and high crystalline non-superconductor layer on an oxide superconductor layer. Additionally, it is very difficult to stack a high crystalline oxide superconductor layer on the non-superconductor layer stacked on an oxide superconductor layer. Though the stacked structure including a first oxide superconductor layer, a non-superconductor layer and a second oxide superconductor layer is realized, the interfaces between the oxide superconductor layers and the non-superconductor layer are not in good condition so that the stacked type junction does not function in good order.

In order to manufacture a point contact type junction, a Dayem bridge type junction and a variable thickness bridge type junction by using oxide superconductor, very fine processings which realize a weak link of a pair of superconductor are necessary. It is very difficult to conduct a fine processing with good repeatability.

The point contact type junction has been formed of two oxide superconductor thin films which are in contact with each other in a extremely small area which constitutes the weak link of the Josephson junction.

The Dayem bridge type junction has been formed of a constant thickness oxide superconductor thin film which is formed on a substrate and which is patterned in a plan view, so that a superconductor thin film region having a greatly narrow width is formed between a pair of superconductor thin film regions having a sufficient width. In other words, the pair of superconductor thin film regions having a sufficient width are coupled to each other by the superconductor thin film region having the greatly narrow width. Namely, a weak link of the Josephson junction in the superconductor thin film is formed at the greatly narrow width region.

On the other hand, the variable thickness bridge type junction has been formed of an oxide superconductor thin film of a sufficient thickness which is formed on a substrate and which is partially etched or thinned in a thickness direction, so that a thinned oxide superconductor thin film portion is formed between a pair of superconductor thin film portions having the sufficient thickness. In other words, the pair of superconductor thin film portions having the sufficient thickness are coupled to each other by the thinned oxide superconductor thin film portion. Accordingly, a weak link of the Josephson junction is romped at the reduced thickness portion of the oxide superconductor thin film.

As would be understood from the above, a characteristics of the Josephson device has a close relation to the contact area of the superconductor thin film in the point contact type Josephson device, the width of the superconductor thin film region having, the greatly narrow width in the Dayem bridge type Josephson device, and to the thickness of the thinned oxide superconductor thin film portion in the variable thickness bridge type Josephson device, both of which form the weak link of the Josephson junction. Therefore, in order to obtain a desired characteristics with a good repeatability, a high precision on a sub-micron level of the processing such as the etching is required.

The Dayem bridge type Josephson device can be said to be more preferable than the variable thickness bridge type Josephson device, since the Dayem bridge type Josephson device has a relatively planer surface, which is preferred in a integrated circuit. However, in order to form the weak link in the Dayem bridge type Josephson device, it is required to pattern an oxide superconductor thin film having the thickness on the order of 0.5 μm to 1.01 μm into a width of not greater than 0.2 μm. However, it is very difficult to conduct this fine patterning with good repeatability.

On the other hand, in the variable thickness bridge type Josephson device, the very fine pattering is not required in order to form the weak link. However, it is very difficult to uniformly control the remaining thickness of the thinned portion forming the weak link. In addition, the variable thickness bridge type Josephson device cannot have a satisfactorily planer surface. This is not preferable to the integrated circuit application.

Therefore, in the prior art, it is almost impossible to manufacture a superconducting device for example a dc SQUID (superconducting quantum interference device) which has multiple homogeneous Josephson junctions by using an oxide superconductor.

SUMMARY OF THE INVENTION

Accordingly, it is an object of the present invention to provide a Josephson junction device including a weak link of the Josephson junction composed of an oxide superconductor material and planar surface, which have overcome the above mentioned defects of the conventional ones.

Another object of the present invention is to provide a method for manufacturing a Josephson junction device with good repeatability by using existing established processing techniques.

The above and other objects of the present invention are achieved in accordance with the present invention by a Josephson junction device comprising a substrate and an oxide superconductor thin film formed on a principal surface of the substrate, which includes two portions constituted of single crystals of the oxide superconductor, lattices of one of which shift at angle of 45° to that of the other, and a grain boundary between said two portions, which constitutes a weak link of the Josephson junction.

Preferably, the Josephson junction device in accordance with the present invention further includes an oxide thin film formed on a portion of the principal surface of the substrate, which is constituted of a single crystal of which lattices shift at angle of 45° to that of the principal surface of the substrate, on which one of the two portions of the oxide superconductor thin film is formed and the other portion of the superconductor thin film is formed on the principal surface of the substrate directly so that the lattices of the two portions of the oxide superconductor thin film are respectively linear up to those of the oxide thin film and the principal surface of the substrate and the grain boundary which constitutes a weak link of the Josephson junction is formed just on the step portion formed of the oxide thin film.

The oxide superconductor thin film can include two apart portions between the two portions, which cross the step portion formed of the oxide thin film so that each of the two apart portions includes the grain boundary which constitutes the weak link of the Josephson junction.

The oxide superconductor thin film can be formed in an annular shape which includes two apart portions crossing the step portion each of which includes the grain boundary which constitutes the weak link of Josephson junction just on the step portion formed by the oxide thin film. In this case, the Josephson junction device constitutes a dc SQUID.

In order to stabilize the Josephson junction properties of the Josephson junction device in accordance with the present invention, it is effective to narrow the portion of the oxide superconductor thin film, which crosses the step portion formed of the oxide thin film so as to have a narrower width than other portions. Preferably, the narrow portion of the oxide superconductor thin film has a width of 1.5 to 15 μm and a length of 5 to 50 μm. The width of the narrow portion of the oxide superconductor thin film of the Josephson junction device in accordance with the present invention is far larger than that of the greatly narrow bridge of a conventional Dayem bridge type Josephson junction device. Therefore, it is possible to relax the limitation in the fine processing techniques such as a fine-etching or a fine-patterning which has been required in the case that conventional Dayem bridge type Josephson junction device.

In a preferred embodiment, the oxide thin film which is constituted of a single crystal of which lattices shift at angle of 45° to that of the principal surface of the substrate is formed of $Eu_1Ba_2Cu_3O_{7-y}$, $Gd_1Ba_2Cu_3O_{7-z}$ or $Sm_1Ba_2Cu_3O_{7-v}$. When these oxide thin films are deposited on a single crystal oxide substrate such as a MgO (100) substrate, a $SrTiO_3$ (110) substrate, an yttrium stabilized zirconia (YSZ) substrate, etc., the oxide thin films grow epitaxially so as to shift their lattices at angle of 45° to lattices of the principal surface of the substrates.

On the other hand, the oxide superconductor thin film deposited on the oxide thin film grows eptaxially so as to conform their lattices to lattices of the oxide thin film.

For this effect, the oxide thin film needs high crystallinity and preferably has a thickness of 1 to 10 nanometers. If the thickness of the oxide thin film is less than 1 nanometer, the oxide grows in the form of islands or in the form of a film of poor crystallinity. In the thickness of the oxide thin film exceeds 10 nanometer, a step is generated clearly on the upper surface of the oxide superconductor thin film, which prevent from composing a planar type device.

In a preferred embodiment, the compound oxide superconductor thin film is formed of a high-$T_c$ (high critical temperature) oxide superconductor, particularly, formed of a high-$T_c$ copper-oxide type compound oxide superconductor for example a Y—Ba—Cu—O type compound oxide superconductor material, a Bi—Sr—Ca—Cu—O type compound oxide superconductor material, and a Tl—Ba—Ca—Cu—O type compound oxide superconductor material.

In addition, the substrate can be formed of a single crystal oxide substrate such as a MgO (100) substrate, a $SrTiO_3$ (110) substrate, an yttrium stabilized zirconia (YSZ) substrate, etc.

According to another aspect of the present invention, there is provided a process of manufacturing a Josephson junction device, comprising the steps of forming on a portion of a principal surface of a substrate an oxide thin film which is composed of a single crystal of which lattices shift at angle of 45° to lattices of the surface of the substrate, and forming an oxide superconductor thin film on the oxide thin film and the exposing principal surface of the substrate so that the oxide superconductor thin film grows epitaxially so as to conform its lattices to those of the oxide thin film and substrate and lattices of a portion of the oxide superconductor thin film, which is deposited on the oxide thin film shift at angle of 45° to those of a portion of the oxide superconductor thin film, which is deposited on the surface of the substrate to form a grain boundary between the two portions of the oxide superconductor thin film just on the step portion formed of the oxide thin film, which constitutes the weak link of the Josephson junction.

The process can include a step of narrowing a portion of the oxide superconductor thin film, which crosses the step portion formed of the oxide thin film by a reactive ion etching process.

In a preferred embodiment, the oxide superconductor thin film is formed by using a silicone plate mask so that the oxide superconductor thin film is shaped so as to include two apart potions crossing the step portion formed of the oxide thin film, each of which includes the grain boundary which constitutes the weak link of the Josephson junction. In this case, the oxide superconductor thin film can be shaped so as to include two apart potions crossing the step portion formed of the oxide thin film, each of which includes the grain boundary which constitutes the weak link of the Josephson junction.

The above and other objects, features and advantages of the present invention will be apparent from the following description of preferred embodiments of the invention with reference to the accompanying drawings.

BRIEF DESCRIPTION OF THE DRAWINGS

FIG. 1C shows a diagrammatic plane view;

DESCRIPTION OF THE PREFERRED EMBODIMENTS

Embodiment 1

Figure 1A:
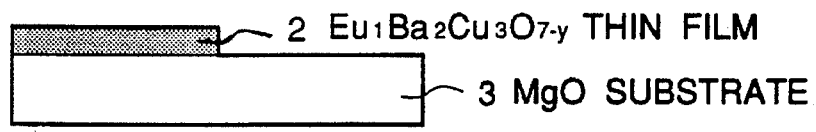
FIGS. 1A to 1C are diagrammatic views for illustrating one embodiment of the process for manufacturing the Josephson device in accordance with the present invention, in that FIGS. 1A and 1B show diagrammatic sectional views, FIG. 1BB shows a plane view of FIG. 1B
Figure 1B:
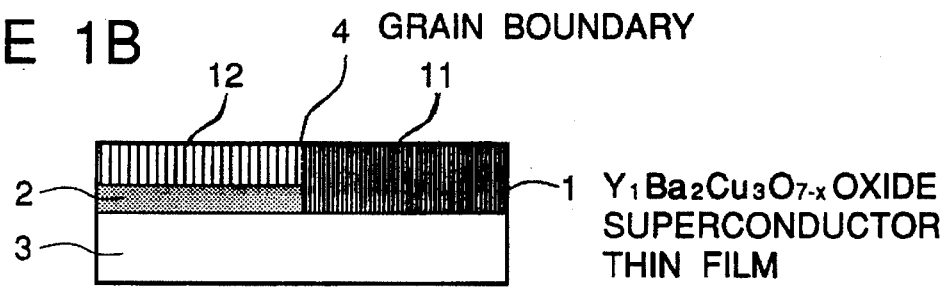
Figure 1B:
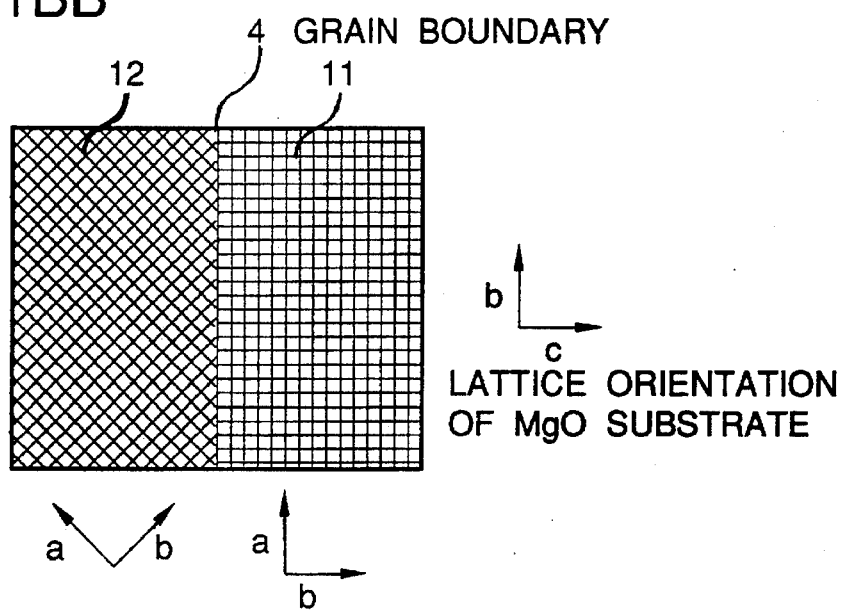
Figure 1C:
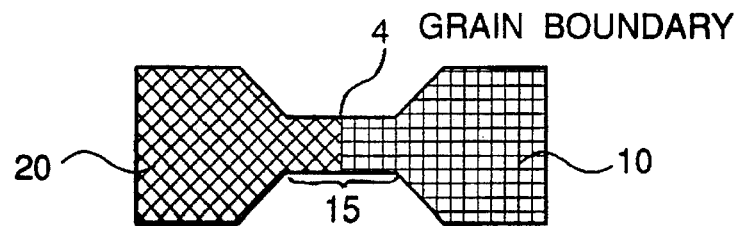

Referring to FIGS. 1A to 1C, the process in accordance with the present invention for manufacturing the Josephson device will be described.

As shown in FIG. 1A, an $Eu_1Ba_2Cu_3O_{7-y}$ thin film 2 having a thickness of 5 nanometers was deposited on the left half of the surface of a MgO (100) single crystal substrate 3 by a sputtering process. The conditions of the sputtering process were as follows;

| Temperature of substrate | | 630° C. |
|---|---|---|
| Sputtering gases | Ar | 8 sccm |
| | $O_2$ | 4 sccm |
| Pressure | | $5 \times 10^{-2}$ Torr |

The $Eu_1Ba_2Cu_3O_{7-y}$ thin film 2 was composed of a single crystal of which a-axes and b-axes shifted at angle of 45° to b-axes and c-axes of the lattices of the surface of the MgO substrate 3.

The oxide thin films of $Eu_1Ba_2Cu_3O_{7-y}$, $Gd_1Ba_2Cu_3O_{7-z}$ and $Sm_1Ba_2Cu_3O_{7-v}$ reproducibly grow on a MgO (100) substrate so that their crystalline lattices shift at an angle of 45° relative to that of the MgO (100) substrate. No special growing technique is required in this process.

This is because the ionic radii of Eu, Gd and Sm are larger than the ionic radius of Y. For example, the ionic radius of Sm is 0.259 nanometers, while the ionic radius of Y is 0.227 nanometers. The large ionic radius results in lattice parameters of $Eu_1Ba_2Cu_3O_{7-y}$, $Gd_1Ba_2Cu_3O_{7-z}$ and $SmBa_2Cu_3O_{7-v}$ that are larger than the lattice parameters of YBCO, so that the mismatch of lattice parameters between $Eu_1Ba_2Cu_3O_{7-y}$, $Gd_1Ba_2Cu_3O_{7-z}$ or $Sm_1Ba_2Cu_3O_{7-v}$ and MgO becomes relatively large. The relatively large mismatch of lattice parameters causes a shift of the crystalline lattices at an angle of 45° relative to that of the MgO.

Compound oxides represented by the formula $Ln_1Ba_2Cu_3O_{7-\delta}$, in which Ln refers to lanthanum, lanthanide or yttrium, have the same crystalline structure, and quite similar or the same properties. Some of these oxides, such as $Y_1Ba_2Cu_3O_{7-x}$, $Ho_1Ba_2Cu_3O_{7-x}$ etc., are oxide superconductors of the so called Y—Ba—Cu—O type. The oxides $Eu_1Ba_2Cu_3O_{7-y}$, $Gd_1Ba_2Cu_3O_{7-z}$ and $Sm_1Ba_2Cu_3O_{7-v}$ used for the oxide thin film of the Josephson junction device in accordance with the present invention have almost the same expansion coefficient as that of an oxide superconductor as $Y_1Ba_2Cu_3O_{7-x}$.

A superconducting device utilizing an oxide superconductor is cooled to a low temperature by liquid nitrogen or liquid helium during the operation. Therefore, cooling from room temperature to the low temperature and heating from the low temperature to room temperature are repeated each time the superconducting device operates. This heat cycle causes peeling or cracking of thin films, particularly an oxide superconductor thin film, if the oxide superconductor thin film and the seed layer are different in their thermal expansion coefficients.

On the contrary, the Josephson junction device in accordance with the present invention has an oxide film (seed layer) of $Eu_1Ba_2Cu_3O_{7-y}$, $Gd_1Ba_2Cu_3O_{7-z}$ or $Sm_1Ba_2Cu_3O_{7-v}$, each of which has almost the same expansion coefficient as that of $Y_1Ba_2Cu_3O_{7-x}$. Therefore, a Josephson junction device in accordance with the present invention is free from the problem of peeling and cracking of the $Y_1Ba_2Cu_3O_{7-x}$ thin film.

In addition, the mutual diffusion between the seed layer and the oxide superconductor thin film generally has an adverse effect on the superconducting characteristics of the oxide superconductor. However, since the seed layer of the Josephson junction device in accordance with present invention is constituted of $Eu_1Ba_2Cu_3O_{7-y}$, $Gd_1Ba_2Cu_3O_{7-z}$ or $Sm_1Ba_2Cu_3O_{7-v}$, each of which has quite similar or the same properties, the mutual diffusion has little effect on the superconducting characteristics of the oxide superconductor.

Then, as shown in FIG. 1B, a c-axis oriented $Y_1Ba_2Cu_3O_{7-x}$ oxide superconductor thin film 1 having a thickness of 300 nanometers were deposited on the $Eu_1Ba_2Cu_3O_{7-y}$ thin film 2 and the exposing right half of the surface of the MgO (100) single crystal substrate 3 by a sputtering process. The conditions of the sputtering process were as follows;

| Temperature of substrate | | 630° C. |
|---|---|---|
| Sputtering gases | Ar | 8 sccm |
| | $O_2$ | 4 sccm |
| Pressure | | $5 \times 10^{-2}$ Torr |

The c-axis oriented $Y_1Ba_2Cu_3O_{7-x}$ oxide superconductor thin film 1 grew epitaxially so as to conform its lattices to those of the $Eu_1Ba_2Cu_3O_{7-y}$ thin film 2 and MgO substrate 3. Therefore, as shown in FIG. 1BB, the a-axes and b-axes of lattices of a portion 12 of the c-axis oriented $Y_1Ba_2Cu_3O_{7-x}$ oxide superconductor thin film 1, which grew on the $Eu_1Ba_2Cu_3O_{7-y}$ thin film 2 shifted at angle of 45° to those of a portion 11 of the $Y_1Ba_2Cu_3O_{7-x}$ oxide superconductor thin film 1, which grew directly on the MgO substrate 3. A grain boundary 4 was created on the interface between the portions 11 and 12, which was just on the step formed by the $Eu_1Ba_2Cu_3O_{7-y}$ thin film 2. The portions 11 and 12 of the $Y_1Ba_2Cu_3O_{7-x}$ oxide superconductor thin film 1 were linked weakly by the grain boundary 4 so that the Josephson junction of which the weak link was constituted of the grain boundary 4 was formed.

Finally, as shown in FIG. 1C, the $Y_1Ba_2Cu_3O_{7-x}$ oxide superconductor thin film 1 was etched by a reactive ion etching process so that the narrow portion 15 having a length of 10 µm and a width of 5 µm, on the center portion of which the grain boundary 4 was positioned, was created between portions 10 and 20 having a sufficient width. The width of the narrow portion 15 was not so narrow as that of a conventional Dayem bridge type Josephson device.

Thus, the Josephson device as shown in FIG. 1C was completed. The Josephson device manufactured by the method in accordance with the present invention was constituted of an oxide superconductor thin film which had a planar surface and a portion 15 having a narrow width between two potions 11 and 12 having a sufficient width. The lattice orientations of two potions 11 and 12 were different from each other so that the two portions 11 and 12 were weakly linked by the grain boundary 4 in the narrow portion 15, which constituted the superconducting barrier of the Josephson device.

A current-voltage characteristics of the above mentioned Josephson device was measured at a temperature of 85K. When a microwave of 15 GHz and of 0.2 mW was irradiated, clear Shapiro steps of was observed at multiple voltages of 31 µV, and therefore, it could be ascertained that the Josephson junction was realized in the device.

As explained above, if the above mentioned Josephson device is manufactured in accordance with the above mentioned process, the limitation in the fine processing technique required for manufacturing the Josephson device is relaxed. In addition, since the superconducting barrier is constituted of the grain boundary, it become easy to form the superconducting barrier sharply. Accordingly, it is easy to manufacture the Josephson device with good repeatability, and the manufactured Josephson device has a stable performance.

Embodiment 2

Figure 2:
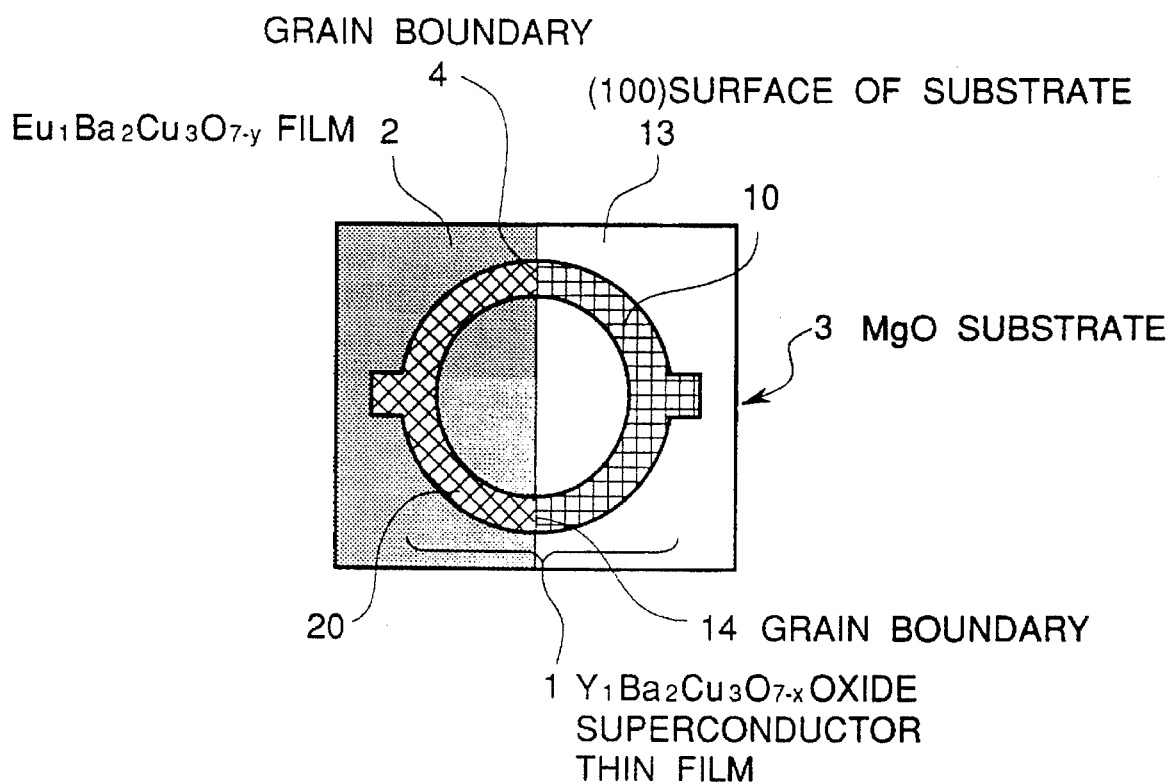
FIGS. 2 is a diagrammatic plane view of a preferred embodiment of the dc SQUID in accordance with the present invention.

Referring to FIG. 2, there is shown a diagrammatic plane view of one embodiment of the superconducting device in accordance with the present invention. The Josephson junction device shown in this embodiment is a dc SQUID.

The dc SQUID includes a MgO (100) substrate 3, a $Eu_1Ba_2Cu_3O_{7-y}$ thin film 2 deposited on the left half of the surface of the MgO substrate 3 and an annular shaped c-axis oriented $Y_1Ba_2Cu_3O_{7-x}$ oxide superconductor thin film 1 formed on the MgO substrate 3 and the $Eu_1Ba_2Cu_3O_{7-y}$ thin film 2. The $Y_1Ba_2Cu_3O_{7-x}$ oxide superconductor thin film 1 is formed an annular ring shape of which two portions cross the step portion formed of the a $Eu_1Ba_2Cu_3O_{7-y}$ thin film 2. The $Eu_1Ba_2Cu_3O_{7-y}$ thin film 2 is composed of a single crystal of which a-axes and b-axes shifted at angle of 45° to b-axes and c-axes of the lattices of the surface of the MgO substrate 3.

The $Y_1Ba_2Cu_3O_{7-x}$ oxide superconductor thin film 1 grows epitaxially so as to conform its lattices to those of the $Eu_1Ba_2Cu_3O_{7-y}$ thin film 2 and MgO substrate 3. Therefore, the a-axes and b-axes of lattices of a portion 20 of the $Y_1Ba_2Cu_3O_{7-x}$ oxide superconductor thin film 1, which is deposited on the $Eu_1Ba_2Cu_3O_{7-y}$ thin film 2 shift at angle of 45° to those of a portion 10 of the $Y_1Ba_2Cu_3O_{7-x}$ oxide superconductor thin film I, which is deposited on the surface 13 of the MgO substrate 3.

Grain boundaries 4 and 14 are formed on the interfaces between the portions 10 and 20 of the $Y_1Ba_2Cu_3O_{7-x}$ oxide superconductor thin film 1 just on the step portion formed by the $Eu_1Ba_2Cu_3O_{7-y}$ thin film 2. The portions 10 and 20 of the $Y_1Ba_2Cu_3O_{7-x}$ oxide superconductor thin film 1 are linked weakly by the grain boundaries 4 and 14 which constituted the superconducting barriers of the Josephson junctions.

The above mentioned dc SQUID was manufactured by the following method in accordance with the present invention. At first, an $Eu_1Ba_2Cu_3O_{7-y}$ thin film 2 was deposited on the left half of the MgO (100) substrate 3 by a sputtering process. The sputtering was performed under the same condition as that of the Embodiment 1.

Then, an annular shaped $Y_1Ba_2Cu_3O_{7-x}$ oxide superconductor thin film 1 was deposited on the $Eu_1Ba_2Cu_3O_{7-y}$ thin film 2 and the exposing right half of the surface of the MgO (100) substrate 3 by a sputtering process in which patterned silicone plate was used as a mask. As mentioned above, a-axes and b-axes of the lattices of the portion 20 of the $Y_1Ba_2Cu_3O_{7-x}$ oxide superconductor thin film 1, which was deposited on the $Eu_1Ba_2Cu_3O_{7-y}$ thin film 2 shift at angle of 45° to those of a portion 10 of the $Y_1Ba_2Cu_3O_{7-x}$ oxide superconductor thin film 1, which was deposited on the surface 13 of the MgO substrate 3.

Figure 3:
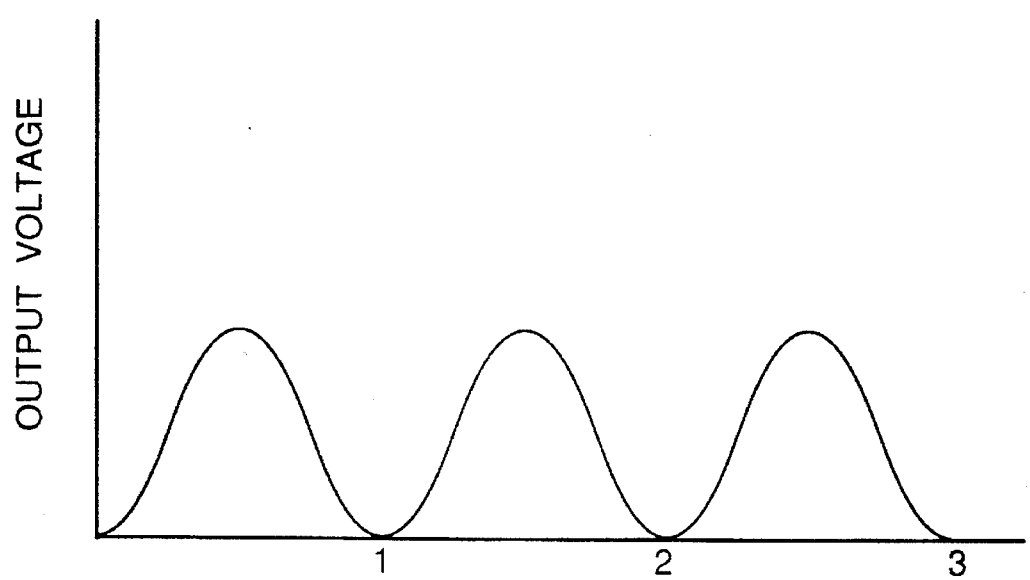
FIGS. 3 is a graph of the output voltage against the magnetic field for the dc SQUID shown in FIG. 2.

A characteristics of the above mentioned dc SQUID was measured while changing temperature. When a faint magnetic field was irradiated, the output voltage of the dc SQUID varied as the graph shown in FIG. 3, and this variation of the output voltage was clearly observed at temperatures up to 85K. Therefore, it could be ascertained that the dc SQUID had excellent properties.

As explained above, if the above mentioned dc SQUID is manufactured in accordance with the above mentioned process, the limitation in the fine processing technique required for manufacturing the dc SQUID is relaxed. In addition, since the superconducting barriers are constituted of the grain boundaries, it become easy to form sharp superconducting barriers of which properties are linear up. Accordingly, it is easy to manufacture the dc SQUID with good repeatability, and the manufactured dc SQUID has a stable performance.

The invention has thus been shown and described with reference to the specific embodiments. However, it should be noted that the present invention is in no way limited to the details of the illustrated structures but converts and modifications may be made within the scope of the appended claims.

We claim:

1. A process of manufacturing a Josephson junction device, comprising the steps of forming on a portion of a principal surface of a substrate a seed layer of an oxide thin film selected from the group consisting of $Eu_1Ba_2Cu_4O_{7-y}$, $Gd_1Ba_2Cu_3O_{7-z}$ and $Sm_1Ba_2Cu_3O_{7-y}$ which is composed of a single crystal, the lattices of which shift at an angle of 45° to lattice of the surface of the substrate, and epitaxially growing an oxide superconductor thin film on the seed layer and on a remaining exposed principal surface of the substrate, wherein the lattices of the oxide superconductor thin film conform to those of the seed layer and substrate, and wherein the lattices of the portion of the oxide superconductor thin film which is deposited on the seed layer shift at an angle of 45° relative to the lattices of the portion of the oxide superconductor thin film which is deposited on the exposed principal surface of the substrate, so that there is a grain boundary between the two portions of the oxide superconductor thin film on a step portion formed by the oxide thin film, which constitutes the weak link of the Josephson junction.

2. A process as claimed in claim 1, additionally comprising a step of etching, by reactive ion etching, that portion of the oxide superconductor thin film which crosses the step portion formed of the oxide thin film, so that the etched portion has a narrower width than the other portions.

3. A process as claimed in claim 1, wherein the oxide superconductor thin film is formed with a silicon plate mask so that the oxide superconductor thin film is shaped so as to include two separate portions that cross the step portion formed of the oxide thin film, each of which comprises a grain boundary which constitutes the weak link of the Josephson junction.

4. A process as claimed in claim 3, wherein the oxide superconductor thin film has an annular shape which includes two separate portions which cross the step portion of the oxide thin film, each of which comprises a grain boundary which constitutes the weak link of the Josephson junction so as to form a SQUID.

5. A process as claimed in claim 2, wherein the oxide superconductor thin film has a narrow portion that has a width of 1.5 to 15 μm and a length of 5 to 50 μm.

6. A process as claimed in claim 1, wherein the oxide superconductor is a high-$T_c$ copper-oxide type compound oxide superconductor.

7. A process as claim in claim 6, wherein the oxide superconductor thin film is an oxide superconductor material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

8. A process as claimed in claim 1, wherein the substrate is a MgO (100) substrate.

9. A process as claimed in claim 1, wherein the oxide thin film has a thickness of 1 to 10 nanometers.

10. A process as claim in claim 8, wherein the oxide superconductor thin film is a Y—Ba—Cu—O type compound oxide superconductor material.

* * * * *